(12) United States Patent
Shon

(10) Patent No.: US 7,811,888 B2
(45) Date of Patent: Oct. 12, 2010

(54) METHOD FOR FABRICATING SEMICONDUCTOR MEMORY DEVICE

(75) Inventor: Hyun Soo Shon, Suwon-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 329 days.

(21) Appl. No.: 12/147,985

(22) Filed: Jun. 27, 2008

(65) Prior Publication Data

US 2009/0233406 A1 Sep. 17, 2009

(30) Foreign Application Priority Data

Mar. 11, 2008 (KR) .................. 10-2008-0022558

(51) Int. Cl.
*H01L 21/336* (2006.01)
*H01L 21/3205* (2006.01)
*H01L 21/4763* (2006.01)

(52) U.S. Cl. .................. 438/265; 438/264; 438/592; 438/257; 438/595; 438/287; 257/E21.158

(58) Field of Classification Search .......... 438/264–265
See application file for complete search history.

(56) References Cited

U.S. PATENT DOCUMENTS

2006/0084255 A1 * 4/2006 Oyu et al. ................ 438/592

FOREIGN PATENT DOCUMENTS

| JP | 2002-094016 | 3/2002 |
| KR | 1020060023489 | 3/2006 |
| KR | 100650903 | 11/2006 |
| KR | 1020070069817 | 7/2007 |

OTHER PUBLICATIONS

Korean Notice of Allowance dated Jan. 29, 2010 for Korean patent application No. 10-2006-0022558, where the attached references were cited.

* cited by examiner

*Primary Examiner*—Ha Tran T Nguyen
*Assistant Examiner*—Valerie Brown
(74) *Attorney, Agent, or Firm*—Lowe Hauptman Ham & Berner LLP

(57) ABSTRACT

A method of fabricating a semiconductor memory device to protect a tunneling insulating layer from etching-damage includes the steps of forming sequentially a tunnel insulating layer, a first conductive layer, a dielectric layer and a second conductive layer on a semiconductor substrate; etching the second conductive layer, the dielectric layer and the first conductive layer to form gate patterns, the first conductive layer remaining on the tunnel insulating layer between the gate patterns to prevent the tunnel insulating layer from being exposed; performing a cleaning process to remove impurities generated in the etching step; performing an ion implanting process to mono-crystallize the first conductive layer remaining on the tunnel insulating layer; and performing an oxidation process to form an oxide layer on top and side walls of the gate patterns and to convert the mono-crystallized first conductive layer into an insulating layer.

14 Claims, 2 Drawing Sheets

METHOD FOR FABRICATING SEMICONDUCTOR MEMORY DEVICE

CROSS-REFERENCE TO RELATED APPLICATIONS

This application claims priority from Korean Patent Application No. 10-2008-0022558, filed on Mar. 11, 2008, the contents of which are incorporated herein by reference in its entirety.

BACKGROUND OF THE INVENTION

The present invention relates to a method for fabricating a semiconductor memory device, more particularly relates to a method for fabricating a semiconductor memory device, in which a tunnel insulating layer is protected from exposure to an etching process for a gate pattern to prevent etching damage to the tunnel insulating layer.

In a semiconductor flash memory device, a gate pattern is generally formed by patterning a conductive layer for a floating gate, a dielectric layer, a conductive layer for a control gate and a gate electrode layer.

FIG. 1 is a sectional view of a semiconductor memory device illustrating a method for manufacturing a semiconductor device according to a conventional technique.

Referring to FIG. 1, a tunnel insulating layer 11, a conductive layer 12 for a floating gate, a dielectric layer 13, a conductive layer 14 for a control gate and a gate electrode layer 15 are sequentially formed on a semiconductor substrate 10. Then, a hard mask pattern is formed, and an etching process using the hard mask pattern is performed to pattern the gate electrode layer 15. Subsequently, the conductive layer 14 for a control gate, the dielectric layer 13 and the conductive layer 12 for a floating gate are sequentially etched to expose the tunnel insulating layer 11.

In the above process for forming the gate patterns in a semiconductor memory device according to the conventional technology, the etching process is performed until the tunnel insulating layer is exposed. Then, a cleaning process is performed to remove polymer generated in the etching process.

The tunnel insulating layer may be damaged by overetching during the etching process or by the cleaning process, degrading a characteristic of the tunnel insulating layer. Due to the above phenomenon, a charge loss may be caused after a program operation of the memory device is completed, thereby degrading a data retention characteristic of the device.

SUMMARY OF THE INVENTION

An objective of the present invention is to provide a method for fabricating a semiconductor memory device, in which a conductive layer with a certain thickness remains on a tunnel insulating layer during a process for forming gate patterns of the semiconductor memory device, the remaining conductive layer is then mono-crystallized in a subsequent ion implanting process to increase a resistance of the conductive layer, and an oxidation process is subsequently performed to convert the conductive layer into an insulating layer. According to the present invention, exposure of the tunnel insulating layer is prevented in the etching process for forming the gate patterns, so that etching-damage to the tunnel insulating layer, which may be caused in the etching process or in a subsequent cleaning process, can be inhibited, thereby improving electrical characteristics of the semiconductor memory device.

The method of fabricating a semiconductor memory device according to one embodiment of the present invention comprises the steps of sequentially forming a tunnel insulating layer, a first conductive layer, a dielectric layer and a second conductive layer on a semiconductor substrate; etching the second conductive layer, the dielectric layer and the first conductive layer to form gate patterns, the first conductive layer remaining on the tunnel insulating layer between the gate patterns to prevent the tunnel insulating layer from being exposed; performing a cleaning process to remove impurities generated in the etching process for forming the gate patterns; performing an ion implanting process to mono-crystallize the first conductive layer remaining on the tunnel insulating layer; and performing an oxidation process to form an oxide layer on top and side walls of the gate patterns and to convert the mono-crystallized first conductive layer into an insulating layer.

The method of fabricating a semiconductor memory device according to the embodiment of the present invention further comprises the step of sequentially forming a gate electrode layer and a hard mask layer on the second conductive layer after forming the second conductive layer.

The first conductive layer remaining on the tunnel insulating layer between the gate patterns preferably has a thickness of 30 to 50 Å.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiment of the present invention will be explained in more detail with reference to the accompanying drawings. It should be noted, however, that the following embodiments of the present invention may take different forms, and therefore, the scope of the present invention is not limited by the following embodiments of the present invention. The description herein is provided for illustrating the present invention more completely to those skilled in the art, and the scope of the present invention should be understood by the appended claims.

FIG. 2 to FIG. 5 are sectional views of a semiconductor memory device for illustrating a method for fabricating a semiconductor memory device according to one embodiment of the present invention.

Figure 1:
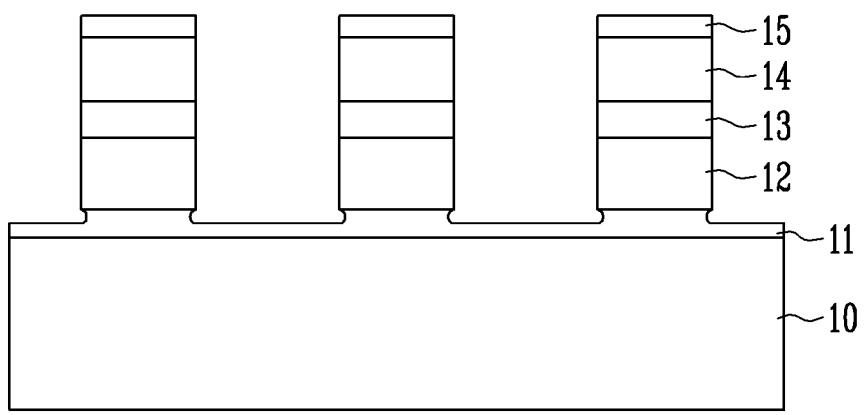
FIG. 1 is a sectional view of a semiconductor device for illustrating a method for fabricating a semiconductor memory device according to a conventional art.
Figure 2:
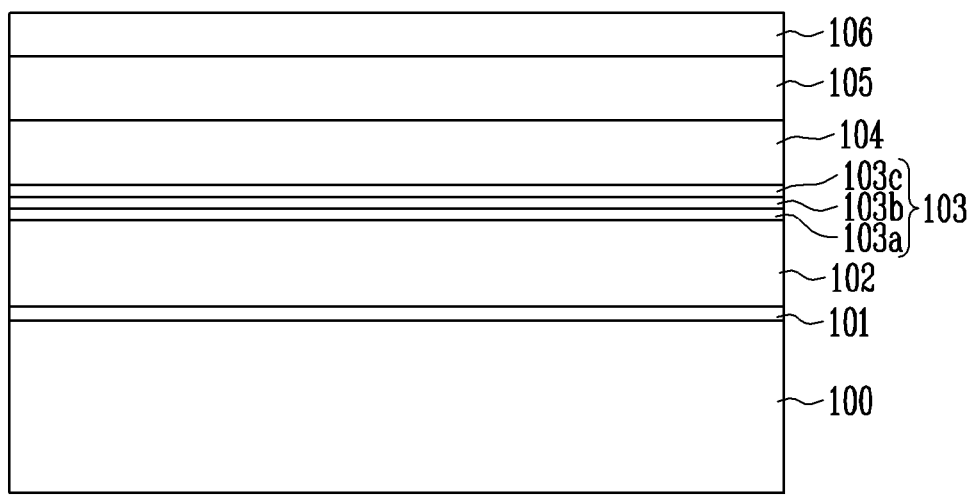
FIG. 2 to FIG. 5 are sectional views of a semiconductor memory device illustrating a method for fabricating a semiconductor memory device according to one embodiment of the present invention.

Referring to FIG. 2, a tunnel insulating layer 101, a conductive layer 102 for a floating gate, a dielectric layer 103, a conductive layer 104 for a control gate, a gate electrode layer 105 and a hard mask layer 106 are sequentially formed on a semiconductor substrate 100.

The conductive layer 102 for the floating gate, and the conductive layer 104 for the control gate may be formed of a polysilicon layer, and it is preferable that the dielectric layer 103 is formed in an ONO structure comprising a first oxide layer 103a, a nitride layer 103b and a second oxide layer 103c. Preferably, the gate electrode layer 105 is formed of a tungsten (W) layer.

It is preferable that the conductive layer 102 for the floating gate is formed of a dual layer comprising an amorphous silicon layer in which no impurity is present and a polysilicon layer containing impurities.

After the conductive layer 104 for a control gate is formed, although not shown in the drawing, it is preferable that a diffusion preventing layer is formed prior to forming the gate electrode layer 105.

Figure 3:
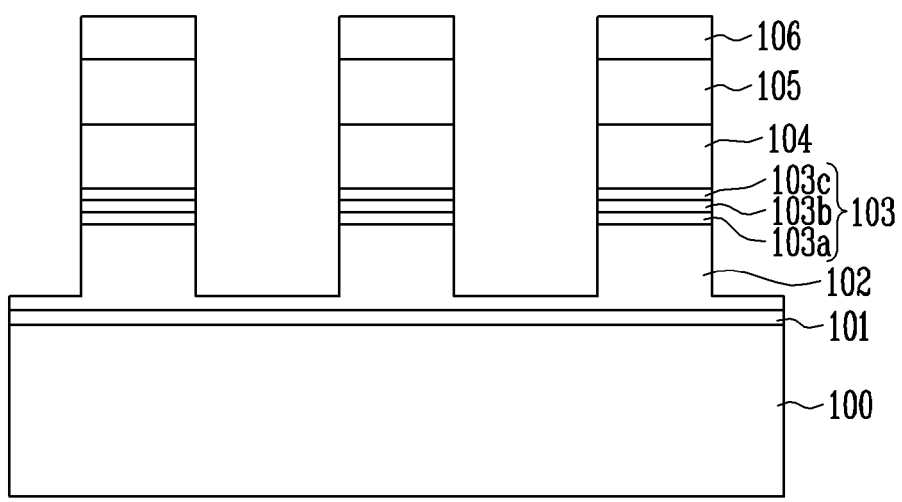

Referring to FIG. 3, photoresist patterns are formed on the hard mask layer 106, and an etching process using the photoresist patterns is then carried out to pattern the hard mask layer 106. Subsequently, an etching process using the patterned hard mask layer 106 is performed to pattern the gate electrode layer 105, the conductive layer 104 for the control gate, the dielectric layer 103 and the conductive layer 102 for the floating gate. As a result, gate patterns are formed. Here, the conductive layer 102 for the floating gate is not fully etched, but a portion of the conductive layer 102 remains on the tunnel insulating layer 101 formed on the semiconductor substrate 100 adjacent to the gate pattern so that a thin layer of the remaining conductive layer 102 covers the tunnel insulating layer 101 between the gate patterns. It is preferable that the etching process is controlled such that the remaining conductive layer 102 has a thickness of 30 to 50 Å. Since the tunnel insulating layer 101 is not exposed, it is not damaged by overetching during the etching process.

Then, a cleaning process is performed to remove impurities (including polymer) generated in the etching process carried out for forming the gate patterns. Again, since the tunnel insulating layer 101 is not exposed but covered with the remaining conductive layer 102, the tunnel insulating layer is not damaged by the cleaning process.

Figure 4:
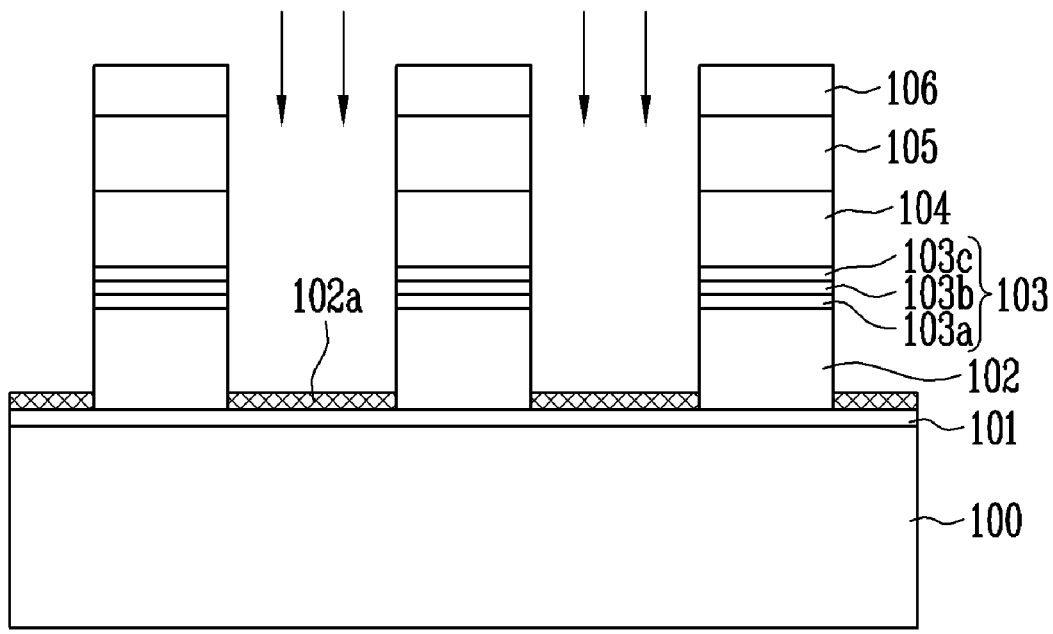

Referring to FIG. 4, an ion implanting process is performed to form source/drain regions in the semiconductor substrate 100 and to form a mono-crystalline conductive layer 102a by mono-crystallizing the exposed polycrystalline conductive layer 102. That is, a linking structure of the polycrystalline conductive layer 102 between the gate patterns, e.g., a polycrystalline silicon layer, is broken by the ions implanted during the ion implanting process so that the conductive layer 102 between the gate patterns is mono-crystallized. The mono-crystalline conductive layer 102a has an increased resistance and reacts easily with another material.

To control a change of a projected range (Rp) caused by a thickness of the mono-crystalline conductive layer 102a, it is preferable that the ion implanting process use an energy of 15 to 25 KeV. Here, the source/drain regions in the semiconductor substrate 100 and the mono-crystalline conductive layer 102a can be formed by a single ion implanting step or by separate two or more implanting steps.

Figure 5:
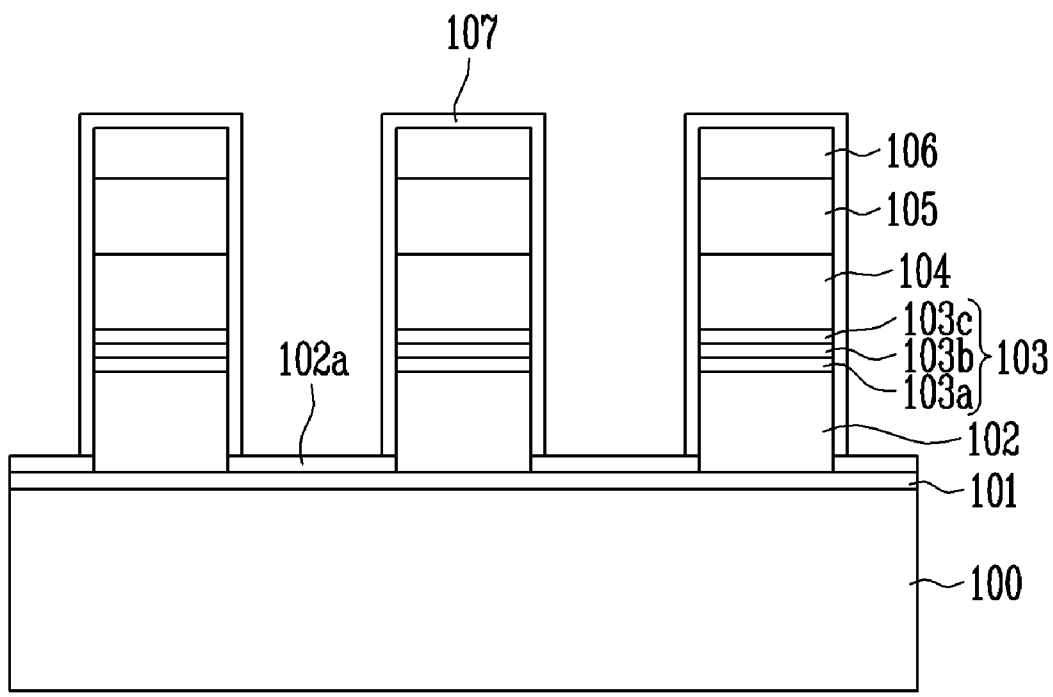

Referring to FIG. 5, an oxidation process is performed to form an oxide layer 107 on side walls and top of the gate patterns and to oxidize the exposed mono-crystalline conductive layer 102a so that the exposed mono-crystalline conductive layer 102a is converted into an oxide layer. As a result, the mono-crystalline conductive layer 102a changes into an insulating layer 102b, so that the gate patterns are electrically isolated from the adjacent gate patterns.

According to one embodiment of the present invention, the conductive layer remains with a certain thickness on the tunnel insulating layer during a process for forming the gate patterns of the semiconductor memory device, the remaining conductive layer is then mono-crystallized in a subsequent ion implanting process to increase a resistance of the conductive layer, and an oxidation process is subsequently performed to convert the mono-crystalline conductive layer into an insulating layer. Therefore, the tunnel insulating layer is not exposed in the process for forming the gate patterns, so that an etching-damage to the tunnel insulating layer which may be caused in the etching process or in the cleaning process can be prevented, thereby improving electrical characteristics of the device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a semiconductor memory device, comprising the steps of:
   forming, sequentially, a tunnel insulating layer, a conductive layer for a floating gate, a dielectric layer and a conductive layer for a control gate on a semiconductor substrate;
   etching the conductive layer for the control gate, the dielectric layer and the conductive layer for the floating gate to form gate patterns, the conductive layer for the floating gate remaining at a predetermined thickness on the tunnel insulating layer between the gate patterns;
   performing an ion implanting process to form a source/drain region on the semiconductor substrate; and
   forming an oxide layer on top and side walls of the gate patterns and converting the conductive layer for the floating gate remaining between the gate patterns into an insulating layer by performing an oxidation process.

2. The method of fabricating a semiconductor memory device of claim 1, wherein the conductive layer for the floating gate comprises a polycrystalline silicon layer.

3. The method of fabricating a semiconductor memory device of claim 2, wherein the conductive layer for the floating gate comprises an amorphous silicon layer containing no impurity and a polycrystalline silicon layer containing impurities.

4. The method of fabricating a semiconductor memory device of claim 2, wherein the ion implanting process mono-crystallizes the conductive layer for the floating gate remaining on the tunnel insulating layer between the gate patterns.

5. The method of fabricating a semiconductor memory device of claim 4, wherein the ion implanting process comprises a single ion implanting step.

6. The method of fabricating a semiconductor memory device of claim 4, wherein the ion implanting process comprises two or more ion implanting steps.

7. The method of fabricating a semiconductor memory device of claim 1, wherein the conductive layer for the floating gate remaining on the tunnel insulating layer between the gate patterns, has a thickness of 30 to 50 Å.

8. The method of fabricating a semiconductor memory device of claim 1, wherein the ion implanting process is performed using an energy of 15 to 25 KeV.

9. A method of fabricating a semiconductor memory device, comprising the steps of:

forming, sequentially, a tunnel insulating layer, a first conductive layer, a dielectric layer and a second conductive layer on a semiconductor substrate;

etching the second conductive layer, the dielectric layer and the first conductive layer to form gate patterns, the first conductive layer remaining on the tunnel insulating layer between the gate patterns to prevent the tunnel insulating layer from being exposed;

performing a cleaning process to remove impurities generated in the etching process for forming the gate patterns;

performing an ion implanting process to mom-crystallize the first conductive layer remaining on the tunneling insulating layer between the gate patterns; and forming an oxide layer on top and side walls of the gate patterns and converting the mom-crystallized first conductive layer into an insulating layer by performing an oxidation process.

10. The method of fabricating a semiconductor memory device of claim 9, wherein the first conductive layer comprises a polycrystalline silicon layer.

11. The method of fabricating a semiconductor memory device of claim 9, wherein the first conductive comprises an amorphous silicon layer containing no impurity and a polycrystalline silicon layer containing impurities.

12. The method of fabricating a semiconductor memory device of claim 9, further comprising the step of sequentially forming a gate electrode layer and a hard mask layer on the second conductive layer after forming the second conductive layer.

13. The method of fabricating a semiconductor memory device of claim 9, wherein the first conductive layer remaining on the tunnel insulating layer between the gate patterns has a thickness of 30 to 50 Å.

14. The method of fabricating a semiconductor memory device of claim 9, wherein the ion implanting process is performed using an energy of 15 to 25 KeV.

* * * * *